United States Patent [19]

Maeno

[11] Patent Number: 5,197,070
[45] Date of Patent: Mar. 23, 1993

[54] SCAN REGISTER AND TESTING CIRCUIT USING THE SAME

[75] Inventor: Hideshi Maeno, Hyogo, Japan

[73] Assignee: Mitsubishi Denki Kabushiki Kaisha, Tokyo, Japan

[21] Appl. No.: 588,877

[22] Filed: Sep. 27, 1990

[30] Foreign Application Priority Data

Sep. 29, 1989 [JP] Japan .................................. 1-255924

[51] Int. Cl.$^5$ .............................................. G01R 31/28
[52] U.S. Cl. ................................... 371/22.3; 371/25.1
[58] Field of Search ................ 371/22.3, 22.1, 25.1, 371/15.1, 21.2, 21.1; 324/73.1, 158 R

[56] References Cited

U.S. PATENT DOCUMENTS

| | | | |
|---|---|---|---|
| 4,926,424 | 5/1990 | Maeno | 371/21.2 X |
| 4,996,691 | 2/1991 | Wilcox | 371/22.3 X |
| 5,103,450 | 4/1992 | Whetsel | 371/22.3 X |

OTHER PUBLICATIONS

Maeno et al., "Testing of Embedded Ram Using Exhaustive Random Sequences", IEEE Feb. 1987 International Test Conference, pp. 105-110.
Funatsu et al., "Designing Digital Circuits With Easily Testable Consideration", IEEE Nov. 1978 Semiconductor Test Conference, pp. 98-102.
Maunder et al., "Boundary-Scan, A Framework for Structured Design-for-Test", IEEE Feb. 1987 International Test Conference, pp. 714-723.

Primary Examiner—Robert W. Beausoliel
Assistant Examiner—Ly V. Hua
Attorney, Agent, or Firm—Lowe, Price, LeBlanc & Becker

[57] ABSTRACT

A scan path composed of a plurality of scan registers comprises a first test mode for testing a RAM, a second test mode for testing a logic circuit and a normal mode. In the first test mode, expected value data is set in each of latch circuits of the scan register. The expected value data held by the latch circuits are determined whether their logics coincide with data read from the RAM in a determination circuit. As a result of this determination, when a fault is occurring in the RAM, the logic of the data held by the latch circuit is inverted. In the second test mode, test data is set in each of latch circuits of the scan register, and the test data set are supplied to the logic circuit. In the normal mode, data read from the RAM is supplied to the logic circuit through the selector circuit without passing through the shift register. Accordingly, the delay time of data propagation path in the normal mode is extremely small and it does not degrade the speed performance of the semiconductor integrated circuit devices.

22 Claims, 7 Drawing Sheets

SCAN REGISTER AND TESTING CIRCUIT USING THE SAME

BACKGROUND OF THE INVENTION

1. Field of the Invention

The present invention relates to a scan register and a testing circuit using the same, and particularly to a scan register and a testing circuit using the same for facilitating tests of semiconductor integrated circuit devices.

2. Description of the Background Art

For example, as shown in IEEE 1987 INTERNATIONAL TEST CONFERENCE CH2347-2 p.p. 105-110 "TESTING OF EMBEDDED RAM USING EXHAUSTIVE RANDOM SEQUENCES" by H. Maeno et al., and IEEE 1978 SEMICONDUCTOR TEST CONFERENCE 78CH 1409-2C p.p. 98-102 "DESIGNING DIGITAL CIRCUITS WITH EASILY TESTABLE CONSIDERATION" by S. Funatu et al., conventionally, a plurality of scan registers are connected to configure a scan path, and semiconductor integrated circuit devices are tested by this scan path. FIG. 1 is a block diagram showing a configuration of a test system using a scan path which the present applicant previously proposed in U.S. application Ser. No. 07/207,919. In the figure, a scan path 1 is provided between a first semiconductor device (a RAM in the figure) 2 and a second semiconductor device (a logic circuit in the figure) 3 on a semiconductor chip SC. This scan path 1, as shown in FIG. 2, comprises a plurality of scan registers SR1 through SRn. Each of the scan registers SR1 through SRn receives parallel output data from the RAM2 as input data PI. Output data PO from each of the scan registers SR1 through SRn are supplied to the logic circuit 3. Scan registers SR1 through SRn are connected in series, and configured to supply output data SO from a scan register at an adjacent previous stage as input data SI to the next one.

Next, the operation of the scan path 1 shown in FIGS. 1 and 2 will be described briefly.

First, in a normal mode, each of the scan registers SR1 through SRn is in a through state, and supplies parallel output data provided from the RAM 2 to the logic circuit 3 as it is received. In other words, each of the scan registers SR1 through SRn supplies the received input data PI as output data PO to the logic circuit 3. Thus, the logic circuit 3 operates in response to the data read from the RAM 3.

Next, in a first test mode testing the RAM 2, a test is performed by writing test data of logic "1" or "0" in all addresses of the RAM 2 and then reading them out. Thus, logic "1" or "0" is written into each of the addresses of the RAM 2 in advance. In this condition, in the scan register SR1 at the first stage of the scan path 1, expected value data are inputted serially from a LSI tester LT. These expected value data are of the same logic as those of test data written into the RAM 2. Scan registers shift each time a bit of expected value data is provided, and finally, expected value data are set in all of the scan registers SR1 through SRn. Each of the scan registers SR1 through SRn compares the set expected value data with the parallel output data read from the RAM 2 and determines whether they coincide with each other or not. As a result of the determination, when an error occurs in a certain bit of the parallel output data from the RAM 2, the logic of the expected data set in the scan register corresponding to the bit is inverted. After that, data set in respective scan registers SR1 through SRn are sequentially shifted by serial shift operations and provided as test results from the scan register SRn at the final stage to a LSI tester LT. By analyzing the test results by a test result determination circuit (not shown) provided in the LSI tester LT, it can be readily determined whether the RAM 2 is normal or not.

Next, in a second test mode testing the logic circuit 3, test data is serially supplied into the scan register SR1 at the first stage of the scan path 1 from the LSI tester LT. As in the case of the expected data, each of the scan registers shifts each time a bit of data is provided, and finally, test data are set in all of the scan registers. The test data set in respective scan registers SR1 through SRn are supplied to the logic circuit 3 as output data PO. Thus, by checking operation by the LSI tester LT based on outputs of the logic circuit 3 for seeing if desired operations according to this test data are performed in the logic circuit 3, it can be known if the logic circuit 3 is normal or not.

FIG. 3 is a circuit diagram illustrating a configuration of a scan register shown in FIG. 2. In the figure, a first input terminal 4 is a terminal which receives the input data SI shown in FIG. 2, a first output terminal 5 is a terminal which outputs the output data SO shown in FIG. 2, a second input terminal 6 is a terminal which receives the input data PI shown in FIG. 2, and a second output terminal 7 is a terminal which provides the output data PO shown in FIG. 2. In the following description herein, the first input terminal 4 is referred to as a serial input terminal, the first output terminal 5 as a serial output terminal, the second input terminal 6 as a parallel input terminal, the second output terminal 7 as a parallel output terminal, respectively.

A shift register stage 8 is provided between the serial input terminal 4 and the serial output terminal 5. A MOS transistor (referred to simply as a transistor hereinafter) 83, a latch circuit 81, a transistor 84 and a latch circuit 82 are connected serially to configure this shift register. At the gates of the transistors 83 and 84, shift clock signals $\phi 1$ and $\phi 2$ are supplied, respectively. The latch circuit 81 is a ratio type latch circuit which is composed of two inverse-parallel connected inverter circuits 81a and 81b. Likewise, the latch 82 is also a ratio type latch circuit, which is composed of two inverse-parallel connected inverter circuits 82a and 82b. The inverter circuit 81a has greater current handling capability than the inverter circuit 81b. The inverter circuit 82a has greater current handling capability than the inverter circuit 82b. The output of the shift register stage 8 at the output of the inverter circuit 82a, is supplied to the parallel output terminal 7, as well as to the serial output terminal 5. The determination circuit 9 comprises an exclusive NOR gate 91 and a NOR gate 92. The output of the inverter circuit 82a is supplied to one input terminal of the exclusive NOR gate 91 and the input data PI is supplied from the parallel input terminal 6 to the other input terminal thereof. A negative clock signal CMP is supplied to one input terminal of the NOR gate 92, the output of the exclusive NOR gate 91 is supplied to the other input terminal thereof. The output of the NOR gate 92 is supplied to the gate of the transistor 10. This transistor 10 is provided between the parallel input terminal 6 and the input terminal of the inverter circuit 81a. A transistor 11 is also connected in parallel with the transistor 10 between the parallel input terminal 6 and the input terminal of the inverter circuit 81a.

Next, the operation of the scan register shown in FIG. 3 will be described.

First, in the normal mode, the transistor 11 and 84 are always in an ON state. Therefore, the input data PI from the parallel input terminal 6 is provided from the parallel output terminal 7 through the transistor 11, the latch circuit 81, the transistor 84 and the latch circuit 82. At this time, the input data PI from the parallel input terminal 6, after its logic is inverted by the inverter circuit 81a, is inverted again by the inverter circuit 82a, so that the output data PO of the parallel output terminal 7 is of the same logic as that of the input data PI from the parallel input terminal 6.

Next, in the first test mode testing the RAM 2 (shown in FIG. 1), expected value data is supplied first at the serial input terminal 4. At this time, at the gates of the transistors 83 and 84, two-phase shift clock signals $\phi 1$ and $\phi 2$, respectively, are supplied, which does not overlap with each other. Accordingly, the shift register stage 8 shifts the provided expected value data. As the shift operations are completed, data of the same logic as that of the provided expected value data is set at the output terminal of the latch circuit 82, or the output terminal of the inverter circuit 82a. Next, data is read from the RAM2 and supplied to the parallel input terminal 6. The exclusive NOR gate 91 compares the output data of the inverter circuit 82a with the input data PI from the parallel input terminal 6 and, when the logics of both data coincide with each other, the logic of its output is "1". Thus, even if the negative clock signal CMP supplied at one input terminal of the NOR gate 92 becomes active ("L" level), its output remains at "L" level (logic "0"). Accordingly, the transistor 10 remains in an OFF state and the input data PI from the parallel input terminal 6 is not supplied to the shift register stage 8. On the other hand, when the logics of the output data of the inverter circuit 82a and the input data PI from the parallel input terminal 6 do not coincide with each other, the output of the exclusive NOR gate 91 becomes "0". Therefore, when the negative clock signal CMP supplied to the NOR gate 92 becomes active ("L" level), its output becomes "H" level (logic "1"). As a result, the transistor 10 turns on and the input data PI from the parallel input terminal 6 is supplied to the latch circuit 81. Thus the input data PI from the parallel input terminal 6 is allowed into the latch circuit 81. Accordingly, at the input terminal of the inverter circuit 81a, data of the logic opposite to that of the expected value data is set. In other words, when the negative clock signal CMP is active, if data different from expected value data is supplied to the parallel input terminal 6 even once, data held in the latch circuit 81 composed of the inverter circuit 81a and 81b is inverted. Subsequently, the shift register stage 8 shifts. By this operation, the data held in the shift registers 8 of respective scan registers are obtained sequentially from the shift register SRn at the final stage.

Next, the operation in the second test mode testing the logic circuit 3 (refer to FIG. 1) will be described. First, test data is provided at the serial input terminal 4. At this time, the shift register stage 8 performs shift operations, and shifts the inputted data sequentially. When the shift operations are completed, test data are set in the latch circuit 81 and 82. Then, the output data of the inverter circuit 82a is of the same logic as that of the test data. The output data of this inverter circuit 82a is supplied to the logic circuit 3 through the parallel output terminal 7.

As described above, by employing scan registers, without requiring reading data from the RAM 2 by serial shift operations for each address, the RAM 2 can be tested efficiently. Also, by serial shift operations of the scan path 1, any data can be supplied to the parallel output terminal 7, so the logic circuit 3 connected on the output side of the RAM 2 can be readily tested.

The scan register shown in FIG. 3, however, has two inverter circuits 81a and 82a provided between the parallel input terminal 6 and the parallel output terminal 7. Consequently, the signal propagation delay time from the RAM 2 to the logic circuit 3 in the normal mode is so large that it has a problem of performance degradation of semiconductor integrated circuit devices.

SUMMARY OF THE INVENTION

An object of this invention is to provide a scan register with extremely small signal propagation delay time in a normal mode and a testing circuit which employs the same.

A scan register according to this invention comprises a first input terminal, a first output terminal, a second input terminal, a second output terminal, register means, selector means, determination means and inverting means. The register means is provided between the first input terminal and the first output terminal and holds input data from the first input terminal. The selector means selects either one of the data held by the register means and the input data from the second input terminal and provides it to the second output terminal. The determination means compares the data held by the register means with the input data from the second input terminal supplied through the selector means, and determines whether their logics coincide with each other or not. The inverting means operates in response to the determination output of the determination means to invert the logic of the data held by the register means.

Another scan register according to this invention comprises a first input terminal, a first output terminal, a plurality of second input terminals, a second output terminal, register means, selector means, determination means and inverting means. The register means is provided between the first input terminal and the first output terminal and holds data supplied from the first input terminal. The selector means selects one data among the data held by the register means and a plurality of input data from the plurality of second input terminals, and provides it to the second output terminal. The determination means compares data held by the register means and input data supplied from the second input terminal through the selector means and determines whether their logics coincide with each other or not. The inverting means operates in response to the determination output of the determination means to invert the logic of the data held by the register means.

A testing circuit according to this invention comprises a plurality of scan registers individually provided between each of the parallel output terminals of the first semiconductor device and each of the parallel input terminals of the semiconductor device. Each scan register comprises register means, selector means, determination means and inverting means. The register means holds expected value data for testing the first semiconductor device or test data to be supplied to the second semiconductor device. The selector means selects either one of the data held by the register means and corresponding output data of the first semiconductor device and provides it to the second semiconductor device. The determination means compares data held by the register means and output data of the first semiconductor device supplied through the selector means, and determines whether their logics coincide with each other or not. The inverting means operates in response to the determination output of the determination means and inverts the logic of the data held by the register means. Each register means is connected in series with register means provided in the respective adjacent scan register.

In this invention, data supplied from the first semiconductor device to the second input terminal is bypassed by the selector means and transferred to the second semiconductor device through the second output terminal without passing through the shift register. As a result, the signal propagation time in a normal mode is very small.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
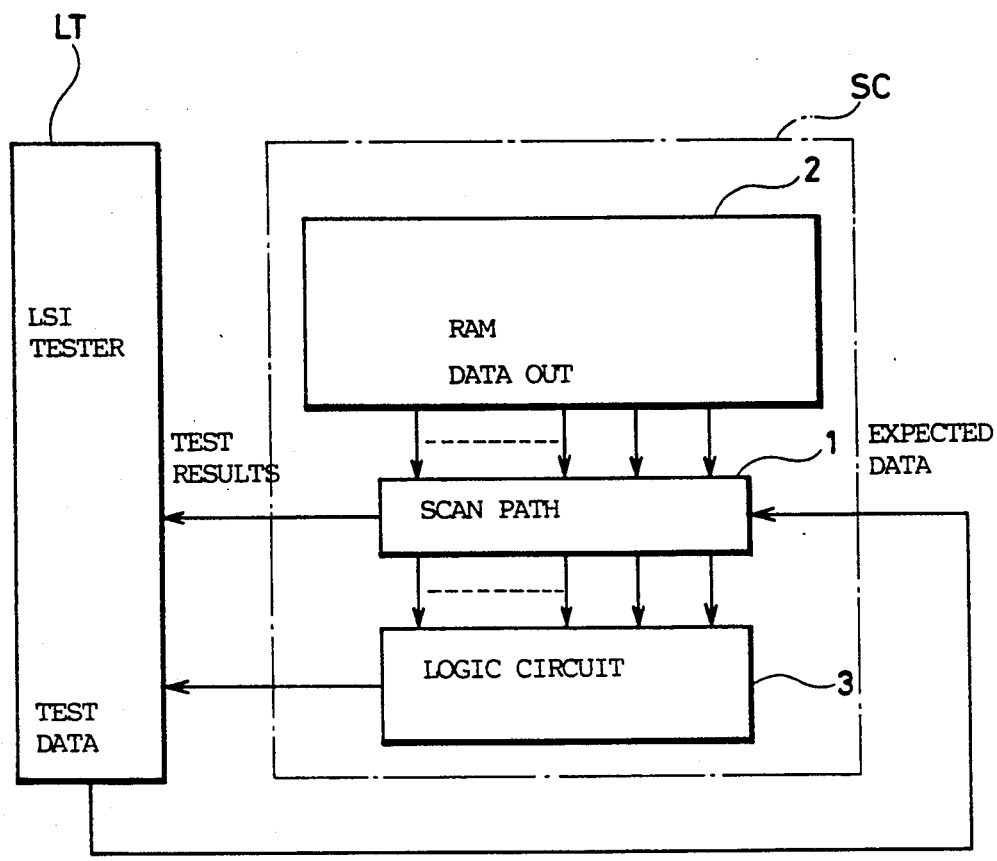
FIG. 1 is a block diagram showing a schematic configuration of a semiconductor integrated circuit device which employs a scan path as a testing circuit.
Figure 2:
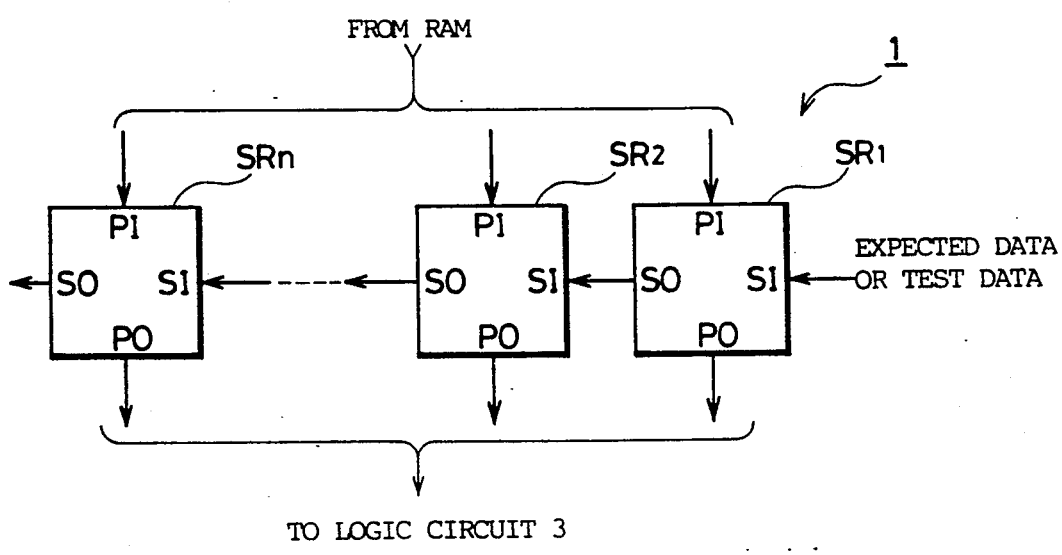
FIG. 2 is a block diagram showing a configuration of the scan path shown in FIG. 1.
Figure 3:
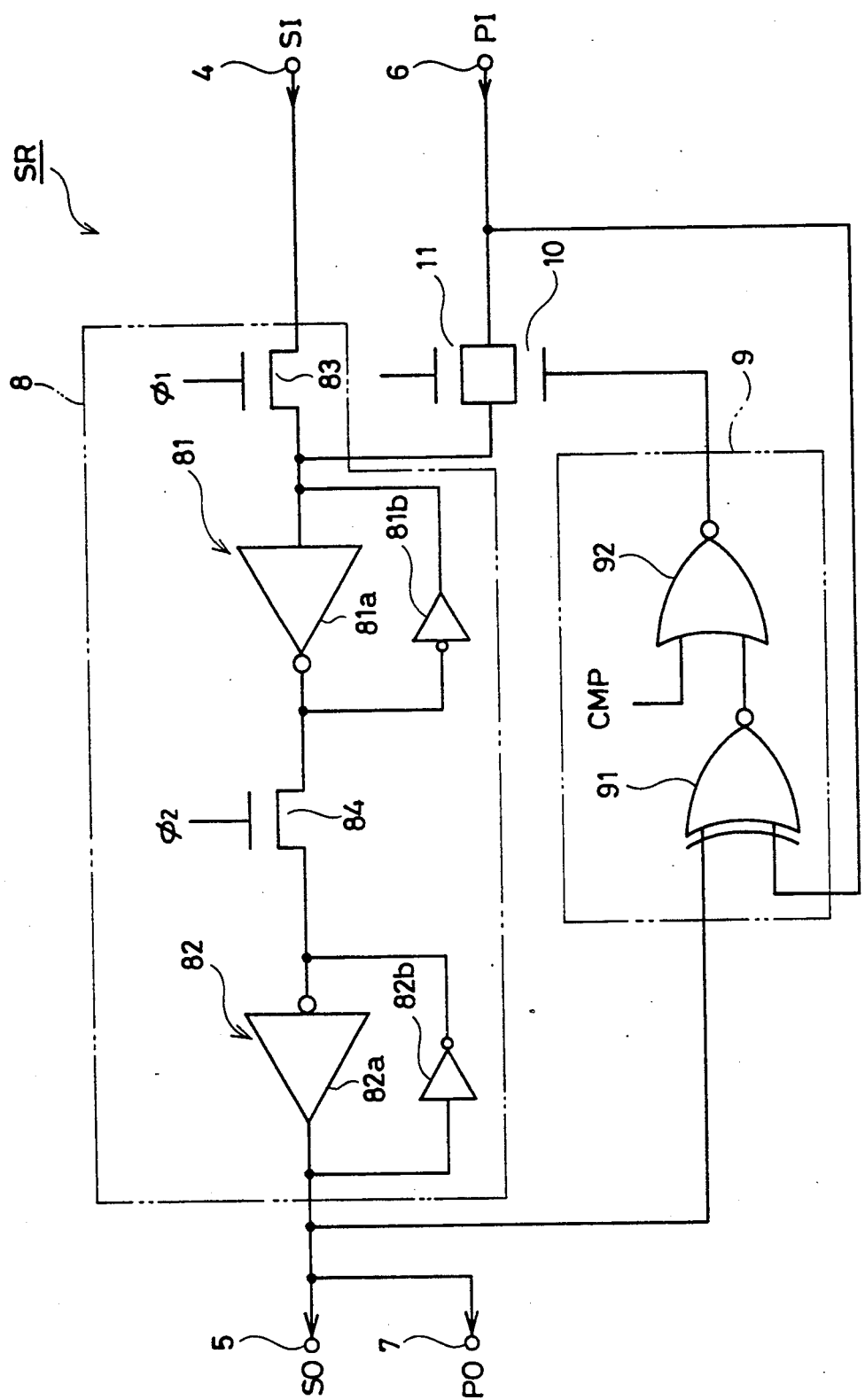
FIG. 3 is a circuit diagram showing a configuration of the scan register shown in FIG. 2.
Figure 4:
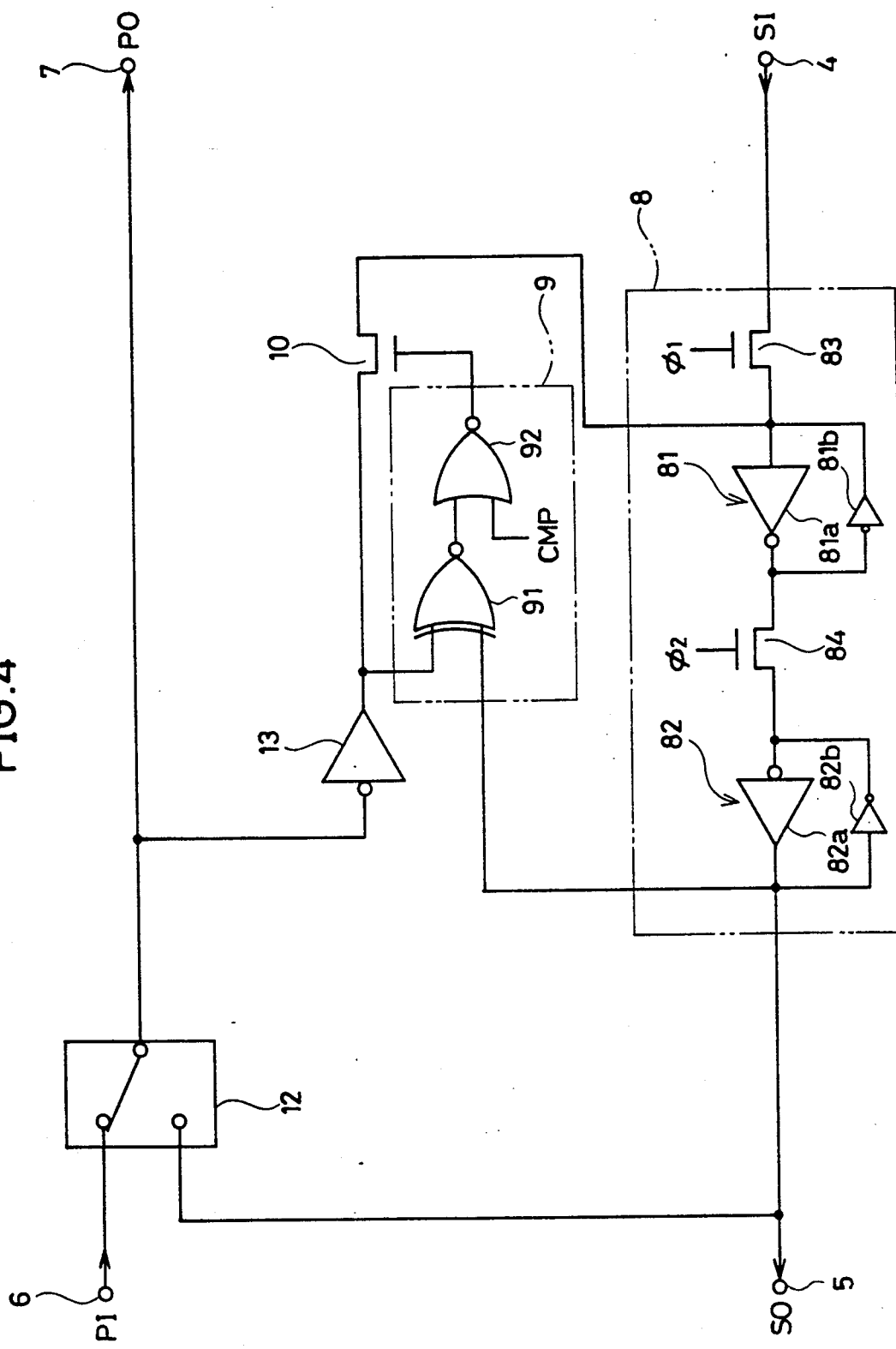
FIG. 4 is a circuit diagram showing a configuration of a scan register in the first embodiment of this invention.

FIG. 4 is a circuit diagram showing a configuration of a scan register in accordance with one embodiment of this invention. Note in advance that a plurality of scan registers as shown in FIG. 4 are connected in series between a first semiconductor device (e.g. a RAM) 2 and a second semiconductor device (e.g. a logic circuit) 3 to form a scan path, as illustrated in FIG. 1. The same is true in other embodiments described below. In the figure, the configuration of this embodiment is identical to that of a scan register shown in FIG. 3 except some points described below, so like reference numerals are assigned to corresponding parts and the description will be omitted. In this embodiment, data PI supplied from a parallel input terminal 6 is directly supplied to a parallel output terminal 7 through a selector circuit 12. That is to say, the selector circuit 12 selects either one of input data PI from the parallel input terminal 6 and output data of the inverter circuit 82a, and supplies it to the parallel output terminal 7. The output of the selector circuit 12 is also supplied to an input terminal of an exclusive NOR gate 91 through an inverter circuit 13. The output of the inverter circuit 13 is supplied to an input terminal of an inverter circuit 81a through a transistor 10.

Figure 5:
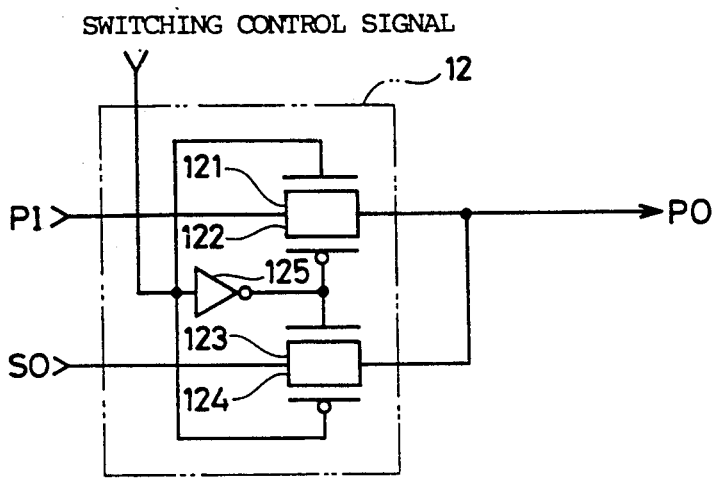
FIG. 5 is a circuit diagram showing an example of the configuration of the selector circuit shown in FIG. 4.

FIG. 5 is a circuit diagram illustrating an example of a configuration of a selector circuit 12 shown in FIG. 4. As shown in the figure, the selector circuit 12 comprises two sets of transistor switches which operate complementarily to each other. The first set of transistor switches comprise a N-channel type transistor 121 and a P-channel type transistor 122 connected in parallel. The second set of transistor switches comprise a N-channel type transistor 123 and a P-channel type transistor 124 connected in parallel. At the gates of the N-channel type transistor 121 and the P-channel type transistor 124, switching control signals are supplied in their original condition. At the gates of the P-channel type transistor 122 and the N-channel type transistor 123, switching control signals inverted by a inverter circuit 125 are supplied. Thus, the first set of transistor switches formed of the transistors 121 and 122 and the second set of transistor switches formed of the transistors 123 and 124 operate complementarily to each other. In other words, when the transistors 121 and 122 are on, the transistors 123 and 124 are off, so that the input data PI is provided as it is as output data PO. On the other hand, when the transistors 121 and 122 are off, the transistors 123 and 124 are on, so that the input data SO itself is provided as output data PO.

In FIG. 4, the inverter circuit 13 is provided to enhance current handling capability of the input data PI, so that said input data PI overcomes the output of the inverter circuit 81b when the input data PI supplied through the selector circuit 12 is provided to the latch circuit 81 through the transistor 10. Accordingly, with said input data PI having sufficient current handling capability, this inverter circuit 13 may be eliminated. However, in this case, it is necessary to invert logic of either one of two inputs supplied to the exclusive NOR gate 91.

Next, the operation of the scan register shown in FIG. 4 will be described.

First, in a normal mode, a selector circuit 12 is switched to select input data PI from the parallel input terminal 6. Therefore, the input data PI read from the RAM 2 (see FIG. 1) and supplied to the parallel input terminal 6 is supplied from the parallel output terminal 7 only through the selector circuit 12 to the logic circuit 3 (see FIG. 1). At this point, as the delay time of the selector circuit 12 is smaller than the delay time of the inverter circuits 81a and 82a in FIG. 3, it hardly results in performance degradation of the semiconductor integrated circuit devices due to the propagation delay of data.

Next, the operation in a first test mode for testing the RAM 2 will be described. In this first test mode, the selector circuit 12 is switched to select the input data PI from the parallel input terminal 6. As the input data PI is supplied to an exclusive NOR gate 91 and a transistor 10 after inverted by the inverter circuit 13, data of the logic opposite to that of the test data written previously in the RAM 2 is used as expected value data. That is, when data of logic "0" are written into all the addresses of the RAM 2, data of logic "1" are used as expected value data. On the contrary, when data of logic "1" are written in all the addresses of the RAM 2, data of logic "0" are used as expected value data. As such expected value data are inputted from the serial input terminal 4, said expected value data are set in the latch circuits 81 and 82 by shift operations of the shift register stage 8. In the case of a normal RAM 2, the logics of the output of the inverter circuit 82a and the input data PI do not coincide with each other. Then, as the logics of two inputs to the exclusive NOR gate 91 coincide with each other, the logic of the output of said exclusive NOR gate 91 becomes "1". Accordingly, even when the negative clock signal CMP becomes active ("L" level), the logic of the output of the NOR gate 92 is "0", and the transistor 10 remains OFF. Hence, the data held by the latch circuit 81 is not inverted. On the other hand, when a fault occurs in the RAM 2, as the outputs of the inverter circuit 82a and the input data PI agree, the logics of two inputs to the exclusive NOR gate 91 disagree, the logic of the output of said exclusive NOR gate 91 becomes "0". Then, when the negative clock signal CMP supplied to the NOR gate 92 becomes active, the logic of the output of the NOR gate 92 becomes "1". Accordingly, the transistor 10 turns on, and the output of the inverter circuit 13 is allowed into the latch circuit 81. At this time, since the logic of the output data of the inverter circuit 13 is in the opposite relationship with the logic of the output data of the inverter circuit 81b, the logic of the data held by the latch circuit 81 is inverted. After that, by the shift operations of the shift register stage 8, data held by each of the latch circuits 81 and 82 are obtained from the serial output terminal 5.

Next, the operation of a second test mode testing the logic circuit 3 will be described. In this second test mode, the selector circuit 12 is switched to select the output of the shift register stage 8 or the output of the inverter circuit 82a. The test data provided from the serial input terminal 4 are set in each of the latch circuits 81 and 82 by shift operations of the shift register stage 8. As this setting operation is completed, the test data held by the latch circuit 82 is supplied from the parallel output terminal 7 through the selector circuit 12 to the logic circuit 3.

Figure 6:
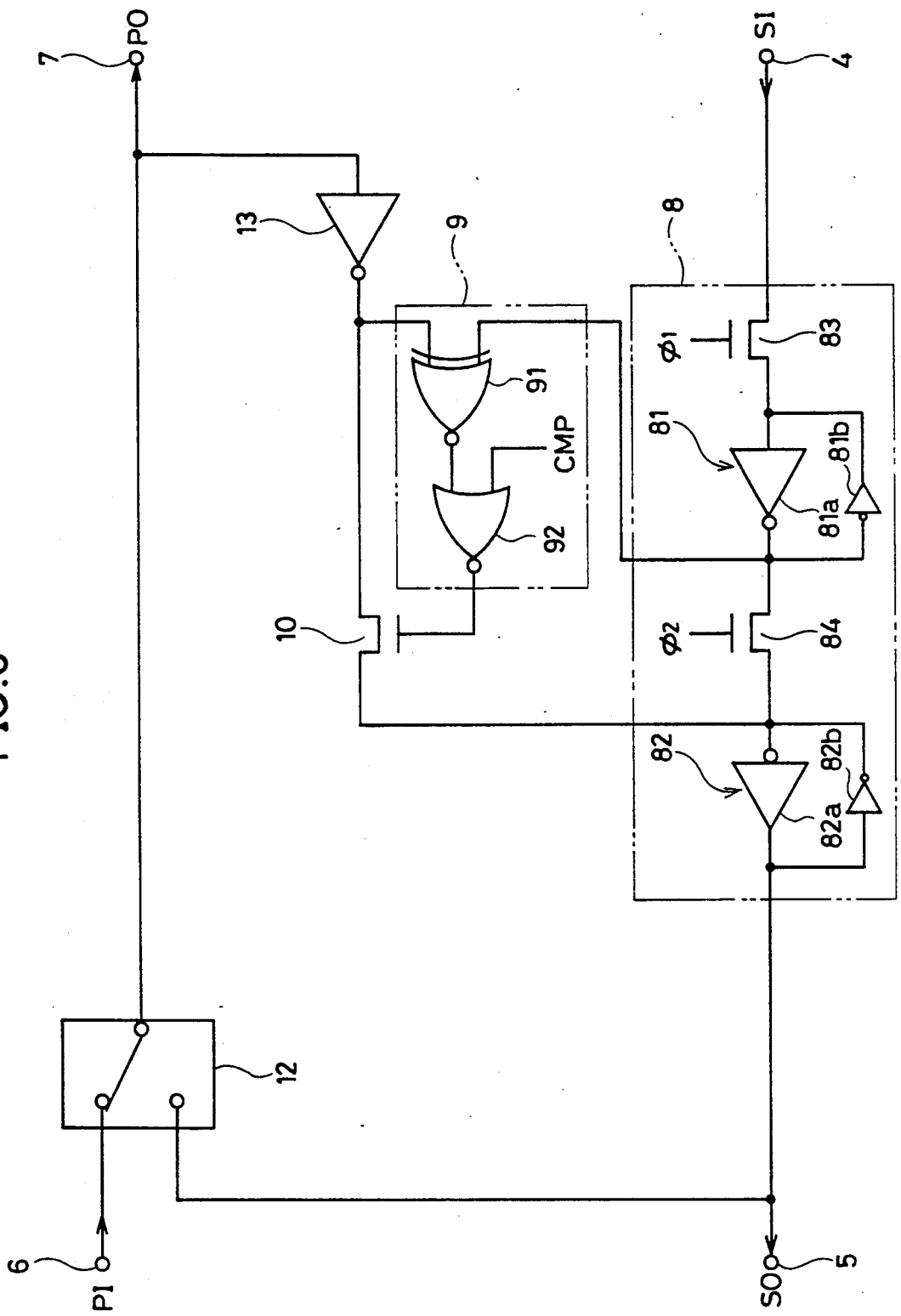
FIG. 6 is a circuit diagram showing a configuration of a scan register in the second embodiment of this invention.

FIG. 6 is a circuit diagram showing the configuration of a scan register in accordance with another embodiment of this invention. Referring to the figure, in this embodiment, output of an inverter circuit 81a is supplied to one input terminal of an exclusive NOR gate 91. A transistor 10 is connected between an inverter circuit 13 and an input terminal of an inverter circuit 82a. Other configurations are similar to those of the embodiment shown in FIG. 4.

In the embodiment of FIG. 6, data held by the latch circuit 81 is compared with the output of the inverter circuit 13. As a result of this comparison, when a fault occurs in the input data PI from the RAM 2, the transistor 10 is turned on and the logic of the data held by the latch circuit 82 is inverted. Other operations are similar to those of the embodiment shown in FIG. 4.

In the embodiment of FIG. 6, expected value data of the same logic as that of the test data previously written into RAM 2 is used.

Figure 7:
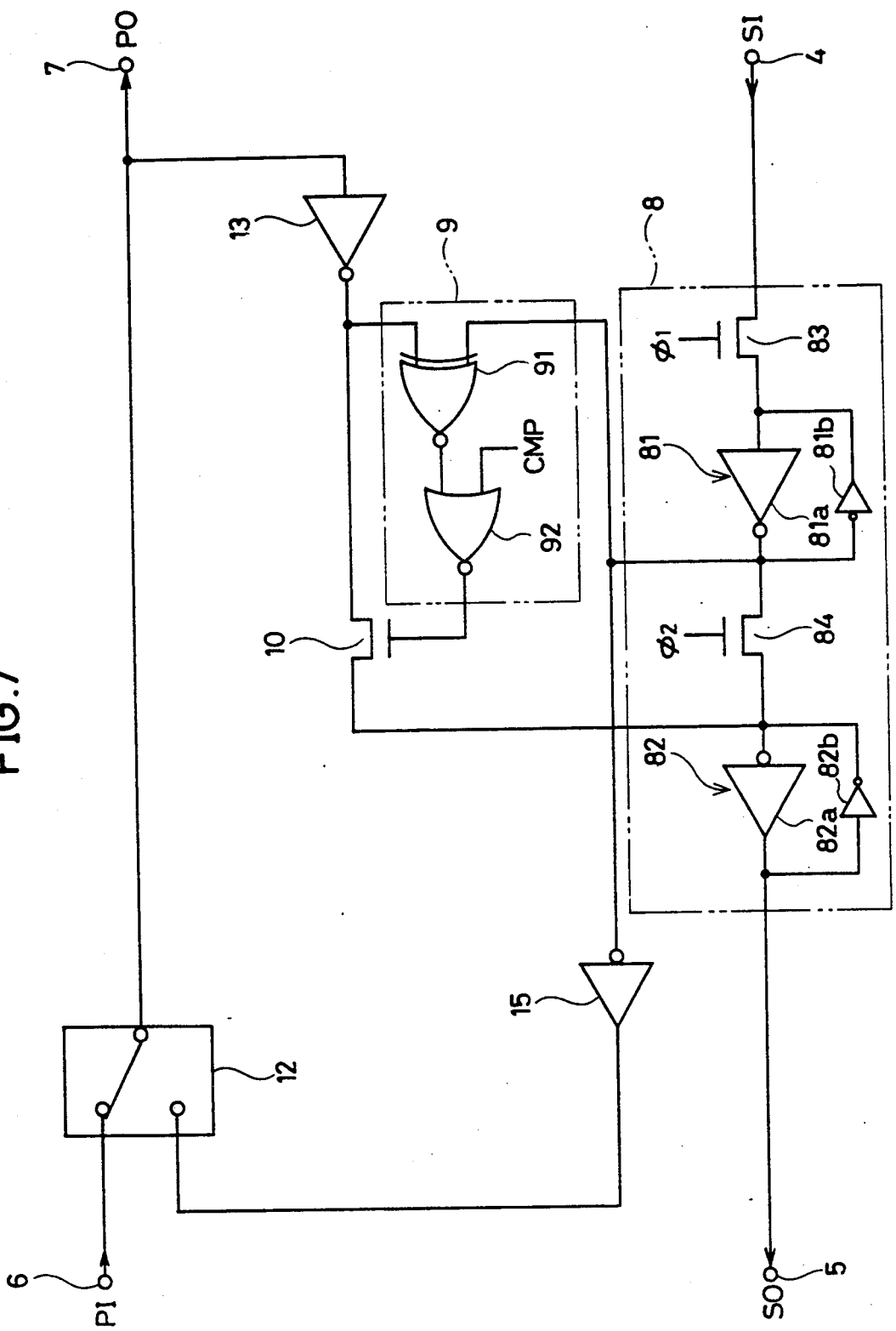
FIG. 7 is a circuit diagram showing a configuration of a scan register in the third embodiment of this invention.

FIG. 7 is a circuit diagram showing a configuration of still another embodiment of this invention. While the output of the inverter circuit 82a is supplied to the selector circuit 12 in the embodiment of FIG. 6, output of an inverter circuit 81a is supplied to a selector circuit 12 through an inverter circuit 15 in this embodiment of FIG. 7. Other configurations are similar to those in the embodiment shown in FIG. 4.

The logic of the output of the inverter circuit 81a and the logic of the output of the inverter circuit 82a are always in an inverted relationship, so that the logic of the output of the inverter circuit 15 is always the same as that of the output of the inverter circuit 82a. Thus, the operation of the embodiment in FIG. 7 is entirely identical to the operation of the embodiment in FIG. 6.

Figure 8:
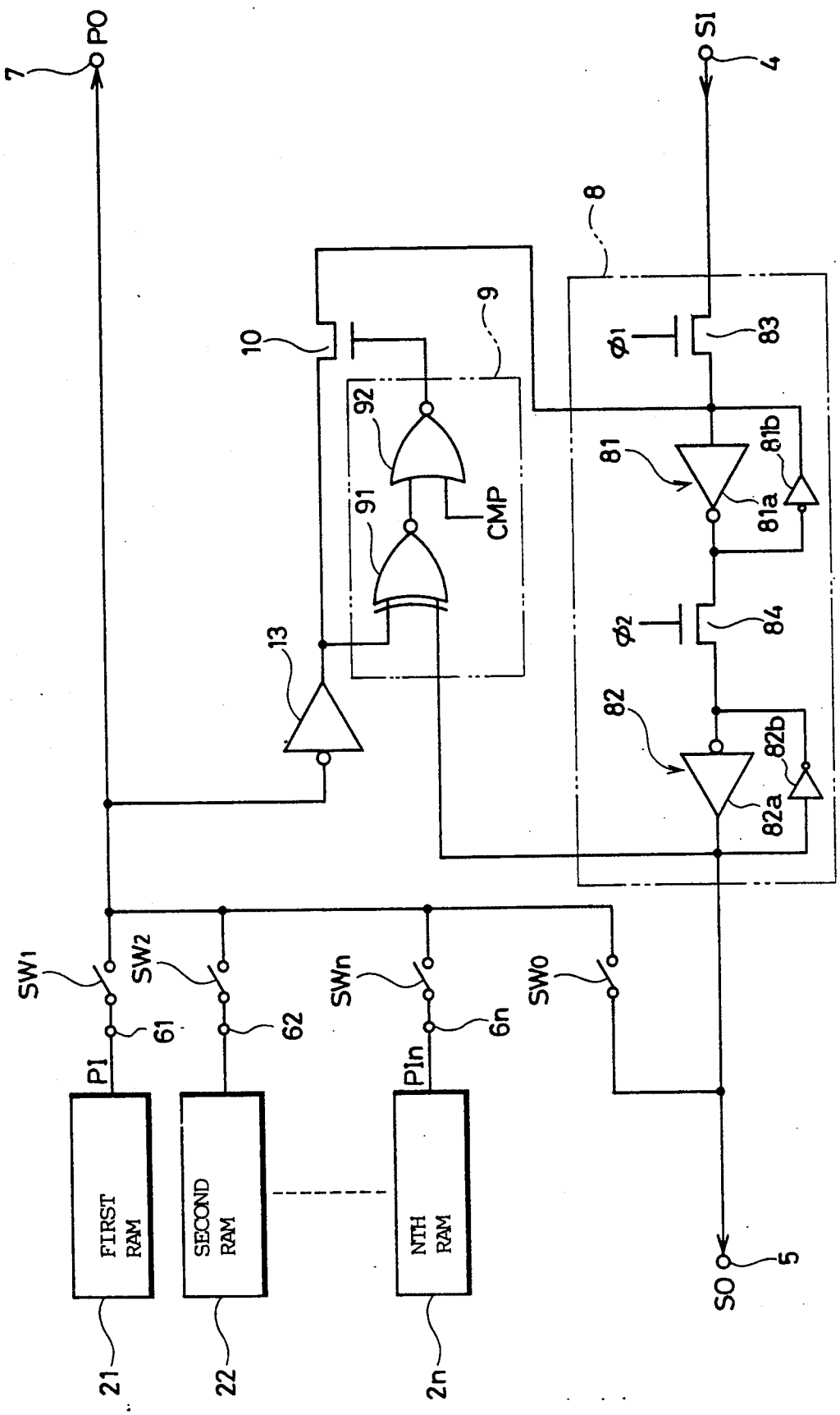
FIG. 8 is a circuit diagram showing a configuration of a scan register in the fourth embodiment of this invention.

FIG. 8 is a circuit diagram showing a configuration of a scan register in accordance with still another embodiment of this invention. In the figure, a semiconductor integrated circuit device to which the embodiment of FIG. 8 is applied is provided with a plurality of RAMs 21 through 2n as first semiconductor devices. A scan register receives input data PI1 through PIn from these RAMs 21 through 2n, respectively, at each of parallel input terminals 61 through 6n. Switches SW1 through SWn are respectively provided between parallel input terminals 61 through 6n and parallel output terminal 7. A switch SW0 is provided between the output terminal of the inverter circuit 82a and the parallel output terminal 7. Other configurations are the same as those in the embodiment shown in FIG. 4.

In the embodiment of FIG. 8 having a configuration described above, in a normal mode, one of the switches SW1 through SWn is turned on and data provided from one of the RAMS 21 through 2n is supplied to the parallel output terminal 7. Similarly, in a first test mode for testing a RAM, a switch corresponding to the RAM to be tested is turned on and data provided from that RAM is supplied to the inverter circuit 13. In the meantime, in a second test mode for testing the logic circuit 3 connected to the parallel output terminal 7, all of the switches SW1 through SWn are turned off and the switch SW0 is turned on. Accordingly, the test data held by the latch circuit 82 of the shift register stage 8 is supplied from the parallel output terminal 7 through the switch SW0 to the logic circuit 3. Other operations are similar to those of this embodiment shown in FIG. 4.

Figure 9:
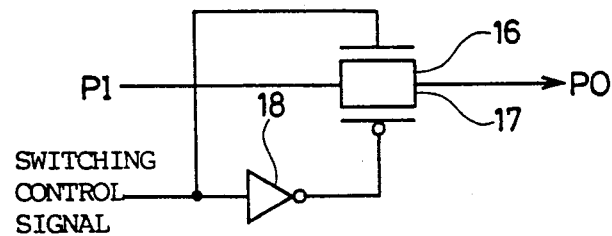
FIG. 9 is a circuit diagram showing an example of a configuration of the switch shown in FIG. 8.

FIG. 9 is a circuit diagram showing one example of a configuration of switches SW1 through SWn, SW0 shown in FIG. 8. In the figure, each of the switches SW1 through SWn and SW0 comprises an N-channel type transistor 16 and a P-channel type transistor 17 connected in parallel. A switching control signal is supplied intactly to the gate of the N-channel type transistor 16. A switching control signal is supplied to the gate of the P-channel type transistor 17 through the inverter circuit 18. Accordingly, both of the transistors 16 and 17 are in an on state when the switching control signal is at "H" level, and in an off state in the case of a "L" level signal. Thus, the transistors 16 and 17 have a switching function.

Figure 10:
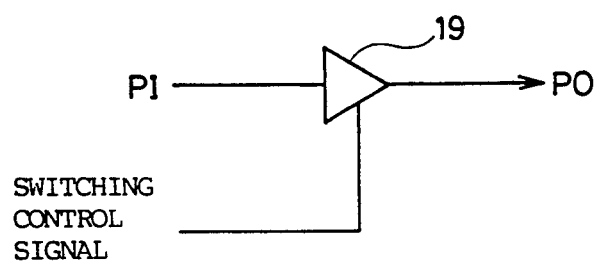
FIG. 10 is a circuit diagram showing another example of a configuration of the switch shown in FIG. 8.

As shown in FIG. 10, a tri-state buffer 19 may be employed as each of the switches SW1 through SWn, SW0. This tri-state buffer 19, when a switching control signal is inactive, comes in a through state, and input data PI itself becomes output data PO. On the other hand, when the switching control signal is active, high impedance state is presented between an input terminal and an output terminal of the tri-state buffer 19. Accordingly, the input data PI is not transmitted to the output terminal side.

While the shift register stage 8 is composed of ratio type latch circuits 81 and 82 in the embodiment described above, it can be composed of other types of latch circuits.

Although expected value data set in the shift register stage 8 is supplied to the determination circuit 9 in the above described embodiment, the expected value data may be supplied from other than a scan path (e.g., an external signal input pin) to the determination circuit 9.

As described above, according to this invention, data supplied from a first semiconductor device to a second input terminal (a parallel input terminal) is by-passed by selector means and supplied from a second output terminal (a parallel output terminal) to a second semiconductor device, so that a scan register and a testing circuit using the same can be obtained, with extremely small signal propagation delay time in a normal mode. Thus, a semiconductor integrated circuit device can be obtained with extremely small degradation of speed performance.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A scan register comprising:
   a first input terminal,
   a first output terminal,
   a second input terminal,
   a second output terminal,
   register means, provided between said first input terminal and said first output terminal, for holding data supplied from said first input terminal,
   selector means selecting either data held by said register means or input data from said second input terminal to provide it to said second output terminal,
   determination means for comparing data held by said register means and input data supplied from said second input terminal through said selector means, and determining if their logical values coincide with each other, and
   inverting means operating in response to a determination output of said determination means to invert the logical value of the data held by said register means.

2. A scan register according to claim 1, wherein said register means comprises a shift register composed of a plurality of latch circuits connected in series, and
   said determination means is provided with data held by one of said plurality of latch circuits.

3. A scan register according to claim 1, wherein said inverting means operates in response to said determination means when the data supplied from said second input terminal does not coincide with the data held by said register means.

4. A scan register according to claim 1, wherein said inverting means operates in response to said determination means when the data supplied from said second input terminal coincides with the data held by said register means.

5. A scan register according to claim 1, wherein said inverting means performs logic inversion only when said determination means determines logical non-coincidence.

6. A scan register, comprising:
   a first input terminal,
   a first output terminal,
   a plurality of second input terminals,
   a second output terminal,
   register means, provided between said first input terminal and said first output terminal, for holding data provided from said first input terminal,
   selector means for selecting the data held by said register means or a plurality of input data from said plurality of second input terminals to provide it to said second output terminal,
   determination means (9) for comparing data held by said register means and input data supplied from said second input terminal through said selector means, and determining whether their logical values coincide with each other, and
   inverting means for inverting the logic of the data held by said register means in response to the determination output of said determination means.

7. A scan register according to claim 6, wherein said register means comprises a shift register composed of a plurality of latch circuits connected in series, and wherein
   said determination means is provided with the data held by one of said plurality of latch circuits.

8. A scan register according to claim 6, wherein said inverting means operates in response to the said determination means when the data supplied from said second input terminal does not coincide with the data held by said register means.

9. A scan register according to claim 6, wherein said inverting means operates in response to said determination means when the data supplied from said second input terminal coincides with the data held by said register means.

10. A scan register according to claim 6, wherein said inverting means performs logic inversion only when said determination means determines logical non-coincidence.

11. A testing circuit comprising a plurality of scan registers individually provided between each of parallel outputs of a first semiconductor device and each of parallel inputs of a second semiconductor device,
    said scan register comprising:
    register means for holding expected value data for testing said first semiconductor device or test data to be supplied to said second semiconductor device;
    selector means for selecting either the data held by said register means and corresponding output data of said first semiconductor device and outputting the same to said second semiconductor device;
    determination mean for comparing the data held by said register means and the output data of said first semiconductor device supplied through said selector means and determining whether their logical values coincide with each other;
    inverting means for inverting the logical value of the data held by said register means in response to the determination output of said determination means; and wherein
    said register means is connected in series with a register means provided in a respective adjacent scan register.

12. A testing circuit according to claim 11, wherein said register means comprises a shift register composed of a plurality of latch circuits connected in series, and wherein said determination means is provided with the data held by one of said plurality of latch circuits.

13. A testing circuit according to claim 11, wherein said inverting means operates in response to said determination means when the data held by said register means does not coincide with the output data of said first semiconductor device.

14. A testing circuit according to claim 11, wherein said inverting means operates in response to said determination means when the data held by said register means coincides with the output data of said first semiconductor device.

15. A testing circuit according to claim 11, wherein said first semiconductor device is a semiconductor storage device.

16. A test circuit according to claim 15, wherein said second semiconductor device is a logic circuit operating in response to data read from said semiconductor storage device.

17. A scan register according to claim 11, wherein said inverting means performs logic inversion only when said determination means determines logical non-coincidence.

18. A method of operating a scan register stage having first and second input terminals and first and second output terminals, and storage means between the first input and output terminals for holding data applied to said first input terminal, comprising the steps of:
selectively supplying directly to said second output terminal, either data held by said storage means or input data applied to said second input terminal;
comparing data applied to said second input terminal with data stored in said register means; and
depending on the result of data comparison in the preceding step, selectively inverting the data stored in said register means.

19. A testing circuit connected between parallel output terminals of a first semiconductor device and parallel input terminals of a second semiconductor device, comprising:
a plurality of scan register stages connected in series with each other and each connected between corresponding input and output pairs of terminals of said first and second semiconductor devices;
each said scan register stage including
(a) storage means for storing expected value data for testing said first semiconductor device and for storing test data to be supplied to said second semiconductor device;
(b) selector means for selecting either data held by said storage means or corresponding output data of said first semiconductor device, and outputting the data selected directly to said second semiconductor device;
(c) comparing means for comparing data held by said storage means with output data of said first semiconductor device supplied through said selector means; and
(d) inverting means responsive to said comparing means for selectively inverting data stored in said storage means.

20. A scan register comprising:
a first input terminal;
a first output terminal;
a second input terminal;
a second output terminal;
register means, provided between said first input terminal and said first output terminal, for holding data supplied from said first input terminal;
selector means selecting either data held by said register means or input data from said second input terminal to provide it to said second output terminal;
determination means for comparing data held by said register means and input data supplied from said second input terminal through said selector means, and determining if their logical values coincide with each other; and
means responsive to a determination output of said determination means for changing a logical value of data held by said register means.

21. A scan register, comprising:
a first input terminal;
a first output terminal;
a plurality of second input terminals;
a second output terminal;
register means provided between said first input terminal and said first output terminal, for holding data provided from said first input terminal;
selector means for selecting the data held by said register means or a plurality of input data from said plurality of second input terminals to provide it to said second output terminal;
determination means for comparing data held by said register means and input data supplied from said second input terminal through said selector means, and determining whether their logical values coincide with each other; and
means responsive to a determination output of said determination means for changing a logical value of the data held by said register means.

22. A testing circuit comprising a plurality of scan registers individually provided between each of parallel output of a first semiconductor device and each of parallel inputs of a second semiconductor device,
said scan register comprising:
register means for holding expected value data for testing said first semiconductor device or test data to be supplied to said second semiconductor device;
selector means for selecting either the data held by said register means or corresponding output data of said first semiconductor device and outputting the same to said second semiconductor device;
determination means for comparing the data held by said register means and the output data of said first semiconductor device supplied through said selector means and determining whether their logical values coincide with each other;
means responsive to a determination output of said determination means for changing a logical value of data held by said register means; and wherein
said register means is connected in series with a register means provided in a respective adjacent scan register.

* * * * *